United States Patent
Nakazato et al.

(10) Patent No.: US 7,053,668 B2
(45) Date of Patent: May 30, 2006

(54) SOI SENSE AMPLIFIER WITH CROSS-COUPLED BODY TERMINAL

(75) Inventors: Takaaki Nakazato, Austin, TX (US); Toru Asano, Austin, TX (US); Osamu Takahashi, Round Rock, TX (US); Sang Dhong, Austin, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 60 days.

(21) Appl. No.: 10/852,863

(22) Filed: May 25, 2004

(65) Prior Publication Data
US 2005/0264324 A1 Dec. 1, 2005

(51) Int. Cl.
*G01R 19/00* (2006.01)
*G11C 7/00* (2006.01)
*H03F 3/45* (2006.01)

(52) U.S. Cl. .................................................. 327/55

(58) Field of Classification Search ............ 327/51–52, 327/55, 534; 365/207–208
See application file for complete search history.

(56) References Cited

U.S. PATENT DOCUMENTS

| | | | | |
|---|---|---|---|---|
| 4,843,264 A * | 6/1989 | Galbraith | .................. | 327/55 |
| 5,854,562 A | 12/1998 | Toyoshima et al. | ............ | 327/55 |
| 5,892,382 A * | 4/1999 | Ueda et al. | ................. | 327/202 |
| 6,222,394 B1 | 4/2001 | Allen et al. | ................... | 327/52 |
| 6,433,589 B1 | 8/2002 | Lee | ............................ | 326/115 |
| 6,480,037 B1 | 11/2002 | Song et al. | ................... | 327/55 |
| 6,833,737 B1 * | 12/2004 | Aipperspach | ................ | 327/55 |
| 2001/0043087 A1 * | 11/2001 | Miyatake et al. | .............. | 327/55 |

\* cited by examiner

*Primary Examiner*—Quan Tra
(74) *Attorney, Agent, or Firm*—Law Offices of Mark L. Berrier

(57) ABSTRACT

Systems and methods for increasing the amount of current that can flow through the data line pull-down transistors in a sense amplifier by tying the bodies of these transistors to a voltage other than ground. In one embodiment, the bodies of the data line pull-down transistors in a sense amplifier are tied to the intermediate nodes on the opposing side of the sense amplifier to increase the current flow through the data line pull-down transistors, and also to reduce the voltage at the intermediate node that will be pulled low by the action of the bit line transistors. In one embodiment, the sense amplifier also includes pre-charge circuits which pre-charge the intermediate nodes to a predetermined voltage that is not reduced by the threshold voltage of the pull-down transistors.

26 Claims, 10 Drawing Sheets

SOI SENSE AMPLIFIER WITH CROSS-COUPLED BODY TERMINAL

BACKGROUND

As devices grow smaller and/or more complex, the electrical components that make up the devices must grow smaller. For example, an integrated circuit may include a large number of logic gates, which in turn are made up of even more transistors. If it is desired to decrease the size of the integrated circuit, the logic gates and the transistors that make up the logic gates must be made smaller. Alternatively, if it is desired to provide additional functions in the integrated circuit, more logic gates (hence transistors) are necessary. If the logic gates and transistors are to take up the same amount of space (i.e., the device is to remain the same size), the logic gates and transistors must again be made smaller.

As transistors are made smaller, the threshold voltages of the transistors are subject to greater variation. That is, the threshold voltage of any one transistor may fall within a wider range of values. Because transistors are often used in pairs, it is desirable for the threshold voltages of each transistor of a pair to be very close to each other, if not the same. If the threshold voltages of the two transistors in a pair are sufficiently different, the device (i.e., logic gate) of which they are components may simply fail to operate. In a device consisting largely of logic components, the failure of one or more of these logic components can cause the device to malfunction, or possibly to cease to function altogether.

The problem of mismatched threshold voltages may be illustrated with respect to a circuit as shown in FIG. 1. The circuit of FIG. 1 is a sense amplifier. Sense amplifier 100 has a pair of bit lines 111 and 112, and a pair of data lines 121 and 122. Sense amplifier 100 is designed to detect slight differences between signals on bit lines 111 and 112, and to amplify these differences. The amplified signals are produced on data lines 121 and 122. An enable signal is input to the circuit on lines 131 and 132. In this embodiment, when the enable signal goes high, the difference between the signals on bit lines 111 and 112 is amplified and provided on data lines 121 and 122.

When sense amplifier 100 is not enabled, nodes 131 and 132 of FIG. 1 are pre-charged to Vdd-Vth, where Vth is the threshold voltage of the respective one of NMOS transistors 141 and 142. In other words, node 131 is pre-charged to Vdd-Vth (of transistor 141), and node 132 is pre-charged to Vdd-Vth (of transistor 142). These pre-charge voltages are equalized somewhat by PMOS transistor 151. When Vdd is low and the pre-charge voltages at nodes 131 and 132 are near the threshold voltage of transistor 151, however, transistor 151 switches very weakly. Consequently, the equalization of the pre-charge voltages between nodes 131 and 132 may not be very good, and there may be a difference between these voltages. This voltage difference may be enough to counteract the voltage difference that would otherwise be detected between bit lines 111 and 112, causing sense amplifier 100 to malfunction.

Further, when sense amplifier 100 is operated at high frequencies, it may be very difficult to pre-charge nodes 131 and 132 to Vdd-Vth. This is a result of several factors. First, the pre-charge time of data lines 121 and 122 becomes short as the voltages of nodes 131 and 132 approach Vdd-Vth (where Vth is the threshold voltage for the respective one of transistors 141 and 142). Also, transistors 141 and 142 are turned off as the voltages at nodes 131 and 132 approach Vdd-Vth. When sense amplifier 100 is activated before nodes 131 and 132 are pre-charged to Vdd-Vth, transistors 161 and 160 operate in a linear region rather than a saturation region, and the current difference that is generated between these transistors becomes smaller. Because the current difference between transistors 161 and 162 is smaller, any mismatch between the threshold voltages of transistors 141 and 142 has a greater impact on the operation of sense amplifier 100. As a result, sense amplifier 100 must be operated more slowly.

SUMMARY OF THE INVENTION

One or more of the problems outlined above may be solved by the various embodiments of the invention. Broadly speaking, the invention comprises systems and methods for increasing the amount of current that can flow through the data line pull-down transistors in a sense amplifier by tying the bodies of these transistors to a voltage other than ground. For instance, in one embodiment, the bodies of the data line pull-down transistors are tied to the intermediate nodes on the opposing side of the sense amplifier. This not only increases the current flow through the data line pull-down transistors, but also enhances the effect by which one of the data line pull-down transistors is pulled low more quickly, while the other pull-down transistors is ultimately pulled high.

One embodiment comprises a method that includes providing a sense amplifier and cross-coupling the data line pull-down transistors of the sense amplifier to the intermediate nodes on the opposing sides of the sense amplifier. For instance, in one embodiment, the sense amplifier includes a pair of input bit lines, a pair of output data lines, a pair of bit line transistors and a pair of data line pull-down transistors. Each input bit line is coupled to the gate of a corresponding one of the bit line transistors. Each output data line is coupled to the source of a corresponding one of the data line pull-down transistors. The drain of the data line pull-down transistor and the source of the bit line transistor corresponding to a data line are coupled to an intermediate node corresponding to that data line. The body of the pull-down transistor on each side is then tied to the intermediate node on the opposing side. In one embodiment, the sense amplifier provided in the method is a device that is constructed using silicon-on-insulator (SOI) technology.

In one embodiment, the method includes pre-charging each intermediate node to a predetermined voltage while the sense amplifier is not enabled. Pre-charging the intermediate nodes may consist of providing a pair of pre-charge circuits, each coupled to one of the intermediate nodes and configured to pre-charge the intermediate node to a predetermined voltage when the sense amplifier is not enabled. In one embodiment, the intermediate nodes are pre-charged by coupling them to a voltage source through pre-charge paths that do not include the data line pull-down transistors. In one embodiment, the method also includes decoupling the pre-charge paths after pre-charging the intermediate nodes and then enabling the sense amplifier.

An alternative embodiment comprises a sense amplifier that includes a pair of input bit lines, a pair of output data lines, a pair of bit line transistors and a pair of data line pull-down transistors. Each input bit line is coupled to the gate of a corresponding one of the bit line transistors. Each output data line is coupled to the source of a corresponding one of the data line pull-down transistors. The drain of the data line pull-down transistor and the source of the bit line transistor corresponding to a data line are coupled to an intermediate node corresponding to that data line. The bodies of the data line pull-down transistors are cross-coupled to the intermediate nodes on the opposing sides of the sense amplifier. In other words, the body of the pull-down transistor on one side is tied to the intermediate node on the other side, and vice versa.

In one embodiment, the sense amplifier is an SOI device. That is, the transistors in the sense amplifier are constructed using SOI technology. In one embodiment, the sense amplifier also includes a pair of pre-charge circuits, each coupled to one of the intermediate nodes. Each pre-charge circuit is configured to pre-charge the corresponding intermediate node to a predetermined voltage while the sense amplifier is not enabled. The pre-charge circuits provide a pre-charge paths that do not include the data line pull-down transistors. Instead, each pre-charge circuit comprises a pre-charge transistor coupled between the intermediate nodes and a power supply at voltage Vdd. The gate of the pre-charge transistor is coupled to receive an enable signal that switches the pre-charge transistor on when the sense amplifier is not enabled and switches the pre-charge transistor off when the sense amplifier is enabled. In one embodiment, the sense amplifier also includes data line pull-up transistors coupled between the data lines and a voltage source. The gates of the data line pull-up and pull-down transistors corresponding to a data line are connected to each other and to the opposing data line. The sense amplifier may also include an upper equalization transistor to equalize the voltages on the gates of all of the data line pull-up and pull-down transistors when the sense amplifier is not enabled. The sense amplifier may also include data line pre-charge transistors coupled between the data lines and a voltage source to pre-charge the data lines to a predetermined voltage (e.g., Vdd) when the sense amplifier is not enabled. The sense amplifier may also include a lower equalization transistor coupled between the intermediate nodes to equalize the voltages at the intermediate nodes when the sense amplifier is not enabled.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
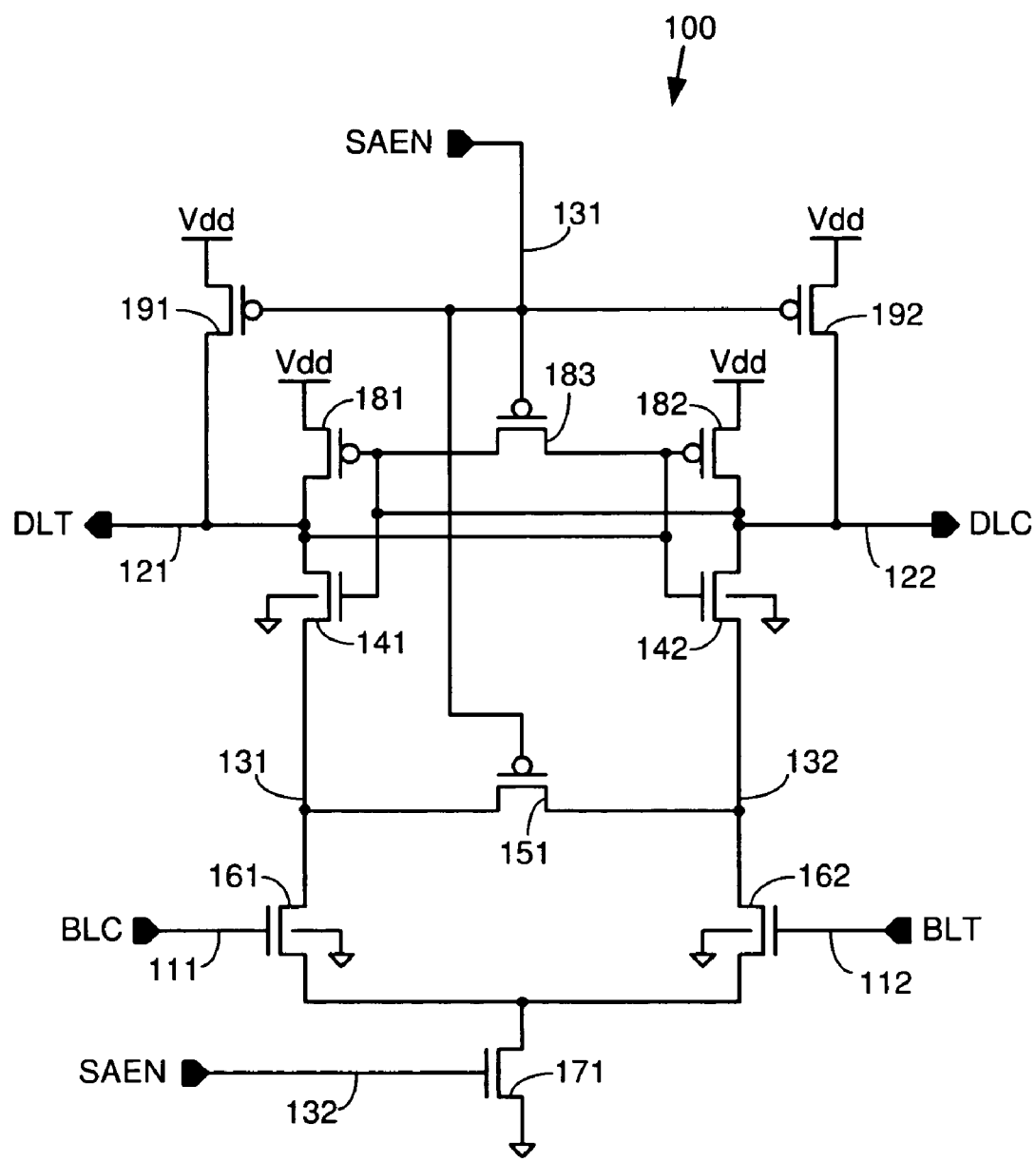
FIG. 1 is a diagram illustrating a sense amplifier in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for increasing the amount of current that can flow through the data line pull-down transistors by tying the bodies of these transistors to a voltage other than ground. In one embodiment, the bodies of the data line pull-down transistors are tied to the intermediate nodes on the opposing side of the sense amplifier to increase the current flow through the data line pull-down transistors. Because the voltages at the intermediate node begin to differ as the sense amplifier is enabled, the body of the pull-down transistor on the side of the sense amplifier that will be pulled low by the action of the bit line transistors is at a higher voltage than the body of the other pull-down transistor, thereby increasing the current flow in the first transistor and enhancing the pull-down action on that side of the sense amplifier.

In one embodiment, the sense amplifier has a pair of input bit lines and a pair of output data lines, where each input bit line is coupled to a corresponding one of the output data lines via two transistors. The input bit line is coupled to the gate of a lower one of the transistors (a bit line transistor), and the source of this lower transistor is coupled to the drain of the higher transistor (a data line pull-down transistor) at an intermediate node. The source of the higher transistor is coupled to the output data line. The sense amplifier may, in one embodiment, be manufactured using silicon-on-insulator (SOI) technology.

Rather than tying the bodies of the data line pull-down transistors to ground, these transistors are body-tied to the opposing ones of the intermediate nodes. In other words, the body of the pull-down transistor on one side of the sense amplifier is tied to the intermediate node on the other side of the sense amplifier, and vice versa. Thus, the bodies of the pull-down transistors are at voltages corresponding to the intermediate node voltages on the opposite sides of the sense amplifier. Because the body voltages of the pull-down transistors are higher than ground, the pull-down transistors allow more current to flow through them and can therefore be operated at higher frequencies than conventional sense amplifiers in which the pull-down transistors are body-tied to ground. Further, because the bodies of the pull-down transistors are tied to the intermediate node voltages on the opposite sides of the sense amplifier, the side that will be pulled low is body-tied to a higher voltage, so it will be pulled low even more quickly.

Prior Art Sense Amplifier

Before describing the embodiments of the invention, it will be helpful to examine the structure and operation of conventional sense amplifiers. Referring again to FIG. 1, an exemplary design of a SOI sense amplifier in accordance with the prior art is shown. Sense amplifier 100 is designed to amplify differences between a pair of bit lines 111 and 112, and to provide the amplified difference on a pair of data lines 121 and 122. Sense amplifier 100 amplifies the difference between the bit line signals when an enable signal input to the circuit goes high.

Sense amplifier 100 comprises 11 transistors. Each of bit lines 111 and 112 is coupled to the gate of a corresponding NMOS transistor, 161 and 162. Transistors 161 and 162 are body-tied to ground. The drain of each of transistors 161 and 162 is coupled to ground via a single NMOS transistor 171. In other words, the drains of transistors 161 and 162 are coupled to the source of transistor 171, and the drain of transistor 171 is coupled to ground. The gate of transistor 171 is coupled to a signal line 132 that carries an enable signal.

The source of each of transistors 161 and 162 is coupled to the drain of a corresponding NMOS transistor, 141 and 142. Each of transistors 141 and 142 is body-tied to ground. The source of each of transistors 141 and 142 is coupled to a corresponding one of data lines 121 and 122. The gates of transistors 141 and 142 are cross-coupled to the opposite ones of data lines and 121 and 122. That is, while the source of transistor 141 is coupled to data line 121, the gate of transistor 141 is coupled to data line 122. Similarly, while the source of transistor 142 is coupled to data line 122, the gate of transistor 142 is coupled to data line 121.

For the purposes of this description, transistors 161 and 162 may be referred to as the bit line transistors. Transistors 141 and 142 may be referred to as the data line pull-down transistors, while transistors 181 and 182 may be referred to as the data line pull-up transistors. Transistors 191 and 192 may be referred to as the data line pre-charge transistors. Transistors 183 and 151 may be referred to as the upper and lower equalization transistors, respectively. Transistor 171 may be referred to as the enable transistor. The corresponding transistors in the various embodiments of the invention may be referred to in the same manner.

Problems with Prior Art Sense Amplifier

One of the problems with sense amplifier 100 is that there may be variations between the different transistors that make up the sense amplifier, and these variations may lead to a slight signal differences which result in incorrect outputs. In other words, sense amplifier 100 may not correctly detect the differences on bit lines 111 and 112 and may therefore produce the wrong signals on data lines 121 and 122.

It can be seen that the design of sense amplifier 100 is symmetric. For each component on the right side of the circuit, there is a corresponding component on the left side of circuit. If there is a difference between the corresponding components on the right and left sides of the circuit, there may be an imbalance that causes the sense amplifier to incorrectly detect and amplify the difference between the signals on bit lines 111 and 112. In particular, the design of sense amplifier 100 is sensitive to mismatches in the threshold voltages of data line pull-down transistors 141 and 142. This is because nodes 131 and 132 are pre-charged in this design to Vdd-Vth, where Vth is the threshold voltage of the respective one of data line pull-down transistors 141 and 142. If nodes 131 and 132 are not pre-charged to the same voltage, there is an imbalance which makes sense amplifier 100 more sensitive to a first one of bit lines 111 and 112 being higher than the other. Thus, even if the second of bit lines 111 and 112 is higher, sense amplifier 100 may operate as if the first bit line were higher. Consequently, sense amplifier 100 may incorrectly indicate on data lines 121 and 122 that the first bit line were higher.

It should be noted that the scaling of devices using sense amplifiers such as the one described above aggravates the problem of mismatches in threshold voltages. In other words, as more sense amplifiers are incorporated into a design, it is desirable to reduce the size of the sense amplifiers so that more of them can be incorporated into the same chip area. Obviously, then, the size of the transistors that are used in the sense amplifiers must also be reduced. As the size of the transistors decreases, the variation in the threshold voltages from one transistor to another increases, making it more likely that the sense amplifiers incorporating these transistors will malfunction as a result of threshold voltage variations. And therefore becomes increasingly important to provide a design for the sense amplifier that is more tolerant of variations in the threshold voltages of the transistors.

Operation of Prior Art Sense Amplifier

The reason the imbalance caused by threshold voltage differences may result in errors is evident when the operation of the circuit is examined. At a high level, sense amplifier 100 is intended to detect differences between the voltages on bit lines 111 and 112 when the sense amplifier is enabled. When sense amplifier 100 is not enabled, it can be viewed as preparing itself (e.g., by pre-charging) to be enabled. It is therefore helpful to first look at sense amplifier 100 when it is not enabled.

Sense amplifier 100 is enabled by signal SAEN. SAEN is applied to the gates of PMOS data line pre-charge transistors 191 and 192. When SAEN is low, data line pre-charge transistors 191 and 192 are turned on. This drives data lines 121 and 122 to voltage Vdd. Vdd is also applied to the gates of PMOS data line pull-up transistors 181 and 182, turning these transistors off. Additionally, Vdd is applied to the gates of NMOS data line pull-down transistors 141 and 142, turning them on. Nodes 131 and 132 are coupled to Vdd through transistors 141 and 142, respectively. As a result, nodes 131 and 132 are charged (or pre-charged, since sense amplifier 100 is not yet enabled) to voltages equal to Vdd-Vth, where Vth is the threshold voltage of the respective one of data line pull-down transistors 141 and 142.

When signal SAEN goes high, sense amplifier 100 is enabled and operates in the following manner. Since signal SAEN is applied to the gates of data line pre-charge transistors 191 and 192, these transistors are turned off when SAEN goes high. This decouples data lines 121 and 122 from Vdd. One of data lines 121 and 122 and therefore be pulled low, depending upon the signals on bit lines 111 and 112. Signal SAEN is also applied to the gate of enable transistor 171, which couples the drains of bit line transistors 161 and 162 to ground. Again, depending upon the signals on bit lines 111 and 112, bit line transistors 161 and 162 are turned on to a greater or lesser extent. That is, one of bit lines 111 and 112 will have a slightly higher voltage than the other, so the corresponding bit line transistor (either 161 or 162) will be more strongly switched on and will therefore allow more current to flow through it. This will allow the voltage at the corresponding one of pre-charged nodes 131 and 132 to be pulled low more quickly than the other. It should be noted that, because SAEN is applied to the gate of lower equalization transistor 151, nodes 131 and 132 are decoupled from each other so that bit line transistor 161 only pulls down the voltage at node 131, while bit line transistor 162 only pulls down the voltage at node 132.

As the voltages at nodes 131 and 132 are pulled down, the voltages at the corresponding ones of data lines 121 and 122 are also pulled down because data line pull-down transistors 141 and 142 are, at least initially, turned on. Because the gates of data line pull-down transistors 141 and 142 are cross-coupled to data lines 121 and 122, these transistors begin to be switched off as the data line voltages drop. Because the voltages on one side of sense amplifier 100 (e.g., and at node 131 and data line 121, or at node 132 and data line 122) more quickly than the other, one of data line pull-down transistors 141 and 142 is turned off more quickly than the other. At the same time, one of data line pull-up transistors 181 and 182, which are also cross-coupled to data lines 121 and 122, is turned on more quickly than the other. Data line pull-up transistors 181 and 182 coupled the respective ones of data lines 121 and 122 to Vdd. Thus, on one side of sense amplifier 100, the voltage at the intermediate node (131 or 132) drops more quickly, the corresponding one of data line pull-down transistors 141 and 142 is switched on more strongly, and the corresponding one of data line pull-up transistors 181 and 182 is switched off more strongly. As a result, the one of data lines 121 and 122 which is on the side as the more rapidly dropping voltage is pulled toward ground, while the other of the data lines is pulled toward Vdd.

Figure 2:
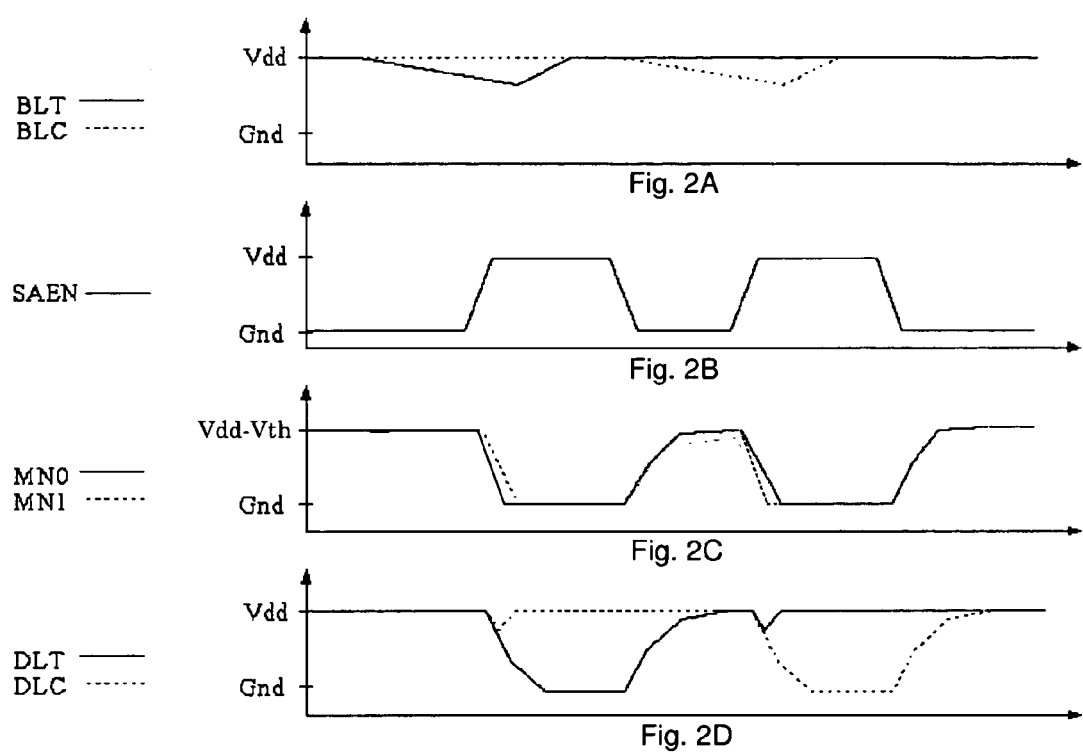
FIGS. 2A–2D are a set of diagrams illustrating the signals associated with the sense amplifier shown in FIG. 1.

This may be made more clear through an example. The signals associated with the sense amplifier in this example are shown in FIG. 2, which includes a set of diagrams illustrating the voltages at different points in sense amplifier 100 over time. FIG. 2A depicts the signals on input bit lines 111 and 112. FIG. 2B shows signal SAEN, which enables or disables sense amplifier 100. FIG. 2C shows the voltages at intermediate nodes 131 and 132. FIG. 2D shows the voltages at output data lines 121 and 122.

In the example of FIG. 2, sense amplifier 100 is initially not enabled. That is, SAEN is low, as shown in FIG. 2B. It is assumed that nodes 131 and 132 are each fully pre-charged to Vdd-Vth. The signals at nodes 131 and 132 are shown in FIG. 2C. Data lines 121 and 122 are pre-charged to Vdd, as shown in FIG. 2D.

The signals on bit lines 111 and 112 are shown in FIG. 2A. In this example, the signal on bit line 111 is at Vdd, and the signal on bit line 112 is slightly lower. When SAEN begins to go high, enabling sense amplifier 100, the voltages at nodes 131 and 132 begin to be pulled low through bit line transistors 161, 162 and enable transistor 171, which couple these nodes to ground. Because the signal on bit line 111 is higher than the signal on bit line 112, bit line transistor 161 is switched on more strongly than bit line transistor 162. The voltage at node 131 is therefore pulled low more quickly than the voltage at node 132. This is shown in FIG. 2C.

As noted above, the data lines are cross-coupled to data line pull-down transistors 141 and 142. Therefore, as each data line is pulled low, it causes the opposing transistor (the one that allows the other data line to be pulled low) to begin to switch off. The opposing data line is therefore pulled low even more slowly. In effect, whichever data line initially begins to the pulled low more quickly keeps gaining an advantage as it causes the transistor coupled to the other data line to switch off. As also noted above, the data lines are cross-coupled to data line pull-up transistors 181 and 182, which couple the data lines to Vdd. As a data line is pulled low, it therefore begins to turn on the transistor coupling the opposing data line to Vdd, in addition to turning off the transistor coupling the opposing data line to the dropping voltage at the intermediate node (131 or 132). The combined effect is to allow whichever data line is pulled low more quickly to continue to be pulled low, while the opposing data line initially begins to be pulled low, but is ultimately pulled high because it is coupled more strongly to Vdd than to the intermediate node (which is pulled to ground).

In the present example, the voltage at node 131 is pulled low more quickly than the voltage at node 132. Because the voltage at node 131 is pulled low more quickly, the voltage on data line 121 is pulled low more quickly than the voltage on data line 122. As a result, data line pull-down transistor 142 begins to be switch to off more rapidly than data line pull-down transistor 141, so the voltage on data line 121 is pulled low even more rapidly than the voltage on data line 122. The more rapidly dropping voltage on data line 121 also causes data line pull-up transistor 182 to begin to switch on more rapidly than data line pull-up transistor 181. This causes data line 122 to be pulled more strongly to Vdd. As this interaction progresses, data line 121 is pulled to ground, while data line 122 is pulled to Vdd. The slight difference between the voltages on that lines 111 and 112 has thereby been amplified to the difference between Vdd and ground on data lines 121 and 122. Meanwhile, the voltages at both of intermediate nodes 131 and 132 have been pulled to ground.

It should be noted that the foregoing discussion of the operation of sense amplifier 100 does not account for variations in the threshold voltages of the data line pull-down transistors. Because the operation of sense amplifier 100 is based on the amplification of small voltage differences on bit lines 111 and 112 and the resulting differences in the voltages at intermediate nodes 131 and 132, it is clear that this design is sensitive to small differences in the voltages at nodes 131 and 132. If the threshold voltages of data line pull-down transistors 141 and 142 are large enough, the resulting differences in the pre-charge voltages at nodes 131 and 132 may cause sense amplifier 100 to malfunction. In other words, the differences may overcome the effects of being pulled down by bit line transistors 161 and 162, and may cause sense amplifier 100 to generate the opposite signals on data lines 121 and 122 than would have been generated if the threshold voltages had been the same.

As noted above, if the threshold voltages of data line pull-down transistors 141 and 142 are different, nodes 131 and 132 will be pre-charged to different voltages. Lower equalization transistor 151 is coupled between nodes 131 and 132 in order to try to equalize these voltages. The equalization achieved by this mechanism, however, may not be effective because, if Vdd is low and Vdd-Vth is near the threshold voltage of transistor 151, transistor 151 may switch very weakly. In other words, transistor 151 may not allow sufficient current to flow through it to allow the voltages at nodes 131 and 132 to equalize. Any voltage mismatch between nodes 131 and 132 may therefore remain.

Another problem that may be experienced by sense amplifier 100 with respect to the pre-charging of nodes 131 and 132 is that, as the sense amplifier is operated at higher frequencies, there is less time during the non-enabled portion of the operating cycle to pre-charge these nodes. This is problematic for two reasons. First, and most clearly, there is less time available for current to flow to/from the nodes to pre-charge the nodes to the pre-charge voltage. Second, and less clearly, the two nodes do not pre-charge equally quickly. This is because nodes 131 and 132 are pre-charged through data line pull-down transistors 141 and 142, respectively. The gates of transistors 141 and 142 are coupled to data lines 122 and 121, respectively. When sense amplifier 100 is enabled (SAEN is high), one of data lines 121 and 122 will be high, while the other will be low. When SAEN goes low, one of data line pull-down transistors 141 and 142 will already be turned on because the corresponding data line will already be high. This transistor will allow the corresponding one of nodes 131 and 132 to pre-charge relatively quickly. The other of transistors 141 and 142, however, will initially be turned off because the corresponding data line was pulled low during the enabled portion of the cycle. This transistor will be gradually turned on as the data line is charged to Vdd. The corresponding one of nodes 131 and 132 will therefore pre-charge more slowly than the other.

It should also be noted that, if nodes 131 and 132 do not have sufficient time to pre-charge to voltage Vdd-Vth, this may cause bit line transistors 161 and 162 to operate in a linear region, rather than in a saturation region. Because the current that can flow through bit line transistors 161 and 162 in a linear region is less than that which can flow through them in the saturation region, the current difference generated between these transistors is also reduced. This makes sense amplifier 100 less tolerant of mismatches in the threshold voltages. It may therefore be necessary to operate sense amplifier 100 at a slower speed in order to reduce malfunctions arising from threshold voltage mismatches.

Exemplary Embodiment—Pre-Charging Intermediate Nodes

In one embodiment, one or more of the problems caused by threshold voltage mismatches can be reduced or eliminated by pre-charging the intermediate nodes through pre-charge paths that do not include the transistors between the bit lines and the data lines. An exemplary embodiment that implements these pre-charge paths is illustrated in FIG. 3.

Figure 3:
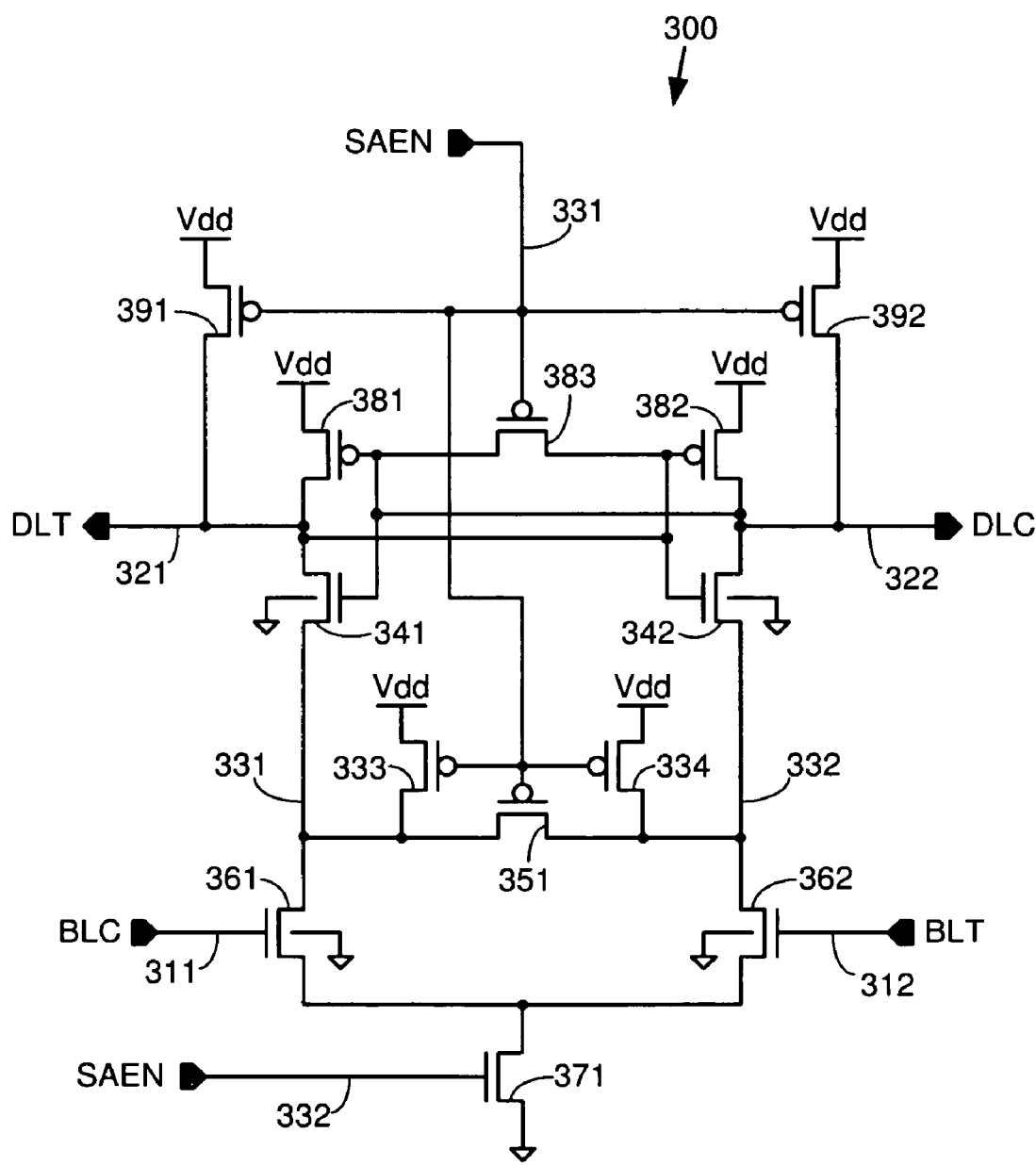
FIG. 3 is a diagram illustrating a sense amplifier that includes pre-charging circuits in accordance with one embodiment.

Referring to FIG. 3, the design of sense amplifier 300 is very similar to the design of sense amplifier 100, which is shown in FIG. 1. Sense amplifier 300 is a SOI-based device that is designed to amplify differences between voltages sensed on bit lines 311 and 312 and to generate the amplified difference on data lines 321 and 322. Sense amplifier 300 is enabled by an enable signal, SAEN.

Sense amplifier 300 includes a pair of PMOS data line pre-charge transistors 391 and 392, each of which is coupled between a voltage source at Vdd and the corresponding one of data lines 321 and 322. When SAEN is low, data line pre-charge transistors 391 and 392 are turned on, so that data lines 321 and 322 are pre-charged to Vdd. When SAEN is high (which enables sense amplifier 300), transistors 391 and 392 are turned off, decoupling data lines 321 and 322 from the voltage sources.

Each of data lines 321 and 322 is coupled to the corresponding one of bit lines 311 and 312 through two NMOS transistors. The bit line (311 or 312) is connected to the gate of a lower one of the transistors (bit line transistors 361 or 362). The gate of the lower transistor (361 or 362) is coupled to ground through an NMOS enable transistor 371 that is switched on and off by signal SAEN. The source of the lower transistor (361 or 362) is coupled to the drain of an upper one of the transistors (data line pull-down transistors 341 or 342) at an intermediate node (331 or 332). The source of the upper transistor (341 or 342) is coupled to the data line (321 or 322). The gate of the upper transistor (341 or 342) is cross-coupled to the opposing one of data lines 321 and 322. That is, the gate of transistor 342 is coupled to data line 321, while the gate of transistor 341 is coupled to data line 322. Data lines 321 and 322 are also cross-coupled to the gates of PMOS data line pull-up transistors 381 and 382. Transistors 381 and 382 are switched on and off by the corresponding one of data lines 321 and 322, so that each of the data lines is coupled to a voltage source at Vdd based on the signal on the other of the data lines.

Sense amplifier 300 also includes two PMOS equalization transistors (351 and 383) that are intended to equalize the voltages on the right and left sides of the sense amplifier. Upper equalization transistor 383 is coupled between the gates of transistors 341 and 381 and the gates of transistors 342 and 382 to equalize the gate voltages when sense amplifier 300 is not enabled (i.e., when SAEN is low). Lower equalization transistor 351 is coupled between intermediate nodes through 331 and 332 to equalize the pre-charge voltages at these nodes when sense amplifier 300 is not enabled.

The difference between sense amplifier 300 and sense amplifier 100 is the addition of PMOS transistors 333 and 334 in sense amplifier 300. The drain of transistor 333 is coupled to intermediate node 331, while the source of transistor 333 is coupled to a voltage source at Vdd. Likewise, the drain of transistor 334 is coupled to intermediate node 332, while the source of transistor 334 is coupled to a voltage source at Vdd. The gates of transistors 333 and 334 are coupled to receive the enable signal, SAEN.

The purpose of transistors 333 and 334 is to provide a pre-charge circuit to pre-charge intermediate nodes 331 and 332. These transistors may therefore be referred to herein as intermediate node pre-charge transistors. When SAEN is low (i.e., sense amplifier 300 is not enabled), transistors 333 and 334 are switched on, coupling intermediate nodes 331 and 332, respectively, to Vdd. When SAEN is high (i.e., sense amplifier 300 is enabled), transistors 333 and 334 are switched off, decoupling intermediate nodes 331 and 332 from the voltage source.

This pre-charge mechanism of sense amplifier 300 is advantageous in comparison to the pre-charge mechanism of sense amplifier 100 because the intermediate nodes (331 and 332) are coupled to the pre-charge voltage (Vdd) without having to traverse the data line pull-down transistors (341 and 342). Because data line pull-down transistors 341 and 342 are taken out of the pre-charge path, each of intermediate nodes 331 and 332 is pre-charged to Vdd, instead of Vdd-Vth, where Vth is the threshold voltage of the one of the data line pull-down transistors corresponding to the respective intermediate node. Because the pre-charge voltages of the intermediate nodes (131 and 132) in sense amplifier 100 vary with differences in the threshold voltages of the data line pull-down transistors (141 and 142), removing the upper transistors from the pre-charge path removes the source of variations in the pre-charge voltages at the intermediate nodes. Consequently, sense amplifier 300 is more tolerant of variations in the threshold voltages of data line pull-down transistors 341 and 342.

Another advantage of sense amplifier 300 compared to sense amplifier 100 is that, because the voltages at intermediate nodes 331 and 332 are higher than the voltages at nodes 131 and 132, lower equalization transistor 351 is switched on more strongly than lower equalization transistor 151. There is therefore better equalization between nodes 331 and 332. In other words, even if there were differences in the voltages to which these nodes were pre-charged, these differences would be reduced by the equalization that is allowed by transistor 351. This results in less sensitivity to threshold voltage mismatches in sense amplifier 300.

Yet another advantage of sense amplifier 300 over prior art designs such as sense amplifier 100 is that, when the intermediate nodes 131 and 132 are pre-charged to a voltage less than Vdd-Vth, bit line transistors 161 and 162 may operate in a region that is below the saturation region. In this instance, the current difference between the two sides as a sense amplifier is not as high as it would be if the transistors were operating in saturation region. When the current is reduced, the voltage differences resulting from threshold voltage variations are more pronounced, by comparison. Thus, by pre-charging intermediate nodes 331 and 332 to Vdd, the current is maximized, and the sensitivity of sense amplifier 300 to variations in the threshold voltages of data line pull-down transistors 341 and 342 is reduced.

It should be noted that, when sense amplifier 100 is operated at high frequencies, it is difficult to pre-charge intermediate nodes 131 and 132 to Vdd-Vth. As the frequency increases, the time allowed for pre-charging becomes short. As the voltages at intermediate nodes 131 and 132 approach Vdd-Vth, data line pull-down transistors 141 and 142 begin to switch off, so there may not be enough time to fully pre-charge the intermediate nodes. This may cause input bit line transistors 161 and 162 to operate in the linear region, rather than the saturation region. This causes the current difference between transistors 161 and 162 to be less than if they were operated in the saturation region and makes sense amplifier 100 less tolerant to mismatches between the threshold voltages of data line pull-down transistors 141 and 142. Thus, the pre-charge mechanism of sense amplifier 300 allows intermediate nodes 331 and 332 to be pre-charged more quickly, which, in turn, allows sense amplifier 300 to be operated at higher frequencies than sense amplifier 100.

It should be noted that, while sense amplifier 300 implements the pre-charging mechanism by connecting the intermediate nodes to the power supply voltage through a pair of pre-charge transistors, alternative embodiments may implement the pre-charging mechanism in other ways. For example, they may make use of other types of transistors driven by other signals, or they may use entirely different components. Such embodiments are nevertheless contemplated to be within the scope of this disclosure.

It should be pointed out that the design of sense amplifier 300 goes against conventional wisdom, in that the teaching in the art is to use fewer transistors, rather than more. As noted above, one of the goals of sense amplifier design is to provide a design that is scalable. Because each transistor in the sense amplifier adds to the area required to implement the device, it is conventionally thought to be preferable to reduce the number of transistors in the design. Thus, it is conventionally believed to be preferable to pre-charge the intermediate nodes of the sense amplifier through the data line pull-down transistors. This is particularly true in the case of sense amplifiers implemented using SOI technology because these devices in particular are implemented in order to operate at higher frequencies, and increasing the number of components in the sense amplifier generally goes against this goal. It should also be noted that the problem of threshold voltage mismatches has only fairly recently become significant because of reductions in the size of sense amplifiers (which results in higher threshold voltage variations) and the use of SOI technology to construct these since amplifiers.

Alternative Embodiment—Cross-Coupling of Pull-Down Transistor Bodies

In another embodiment, one or more of the problems that are present in prior art sense amplifier 100 can be reduced or eliminated by providing a cross-coupling mechanism to dynamically alter the threshold voltages of the upper pair of NMOS transistors. By tying the bodies of these transistors to the voltages at the intermediate nodes rather than to ground, the current that flows through these transistors is increased. This increases the speed at which the sense amplifier can be operated. Further, because the voltages at the intermediate nodes change, the threshold voltages of the transistors also change, thereby enhancing the operation of the sense amplifier.

Figure 4:
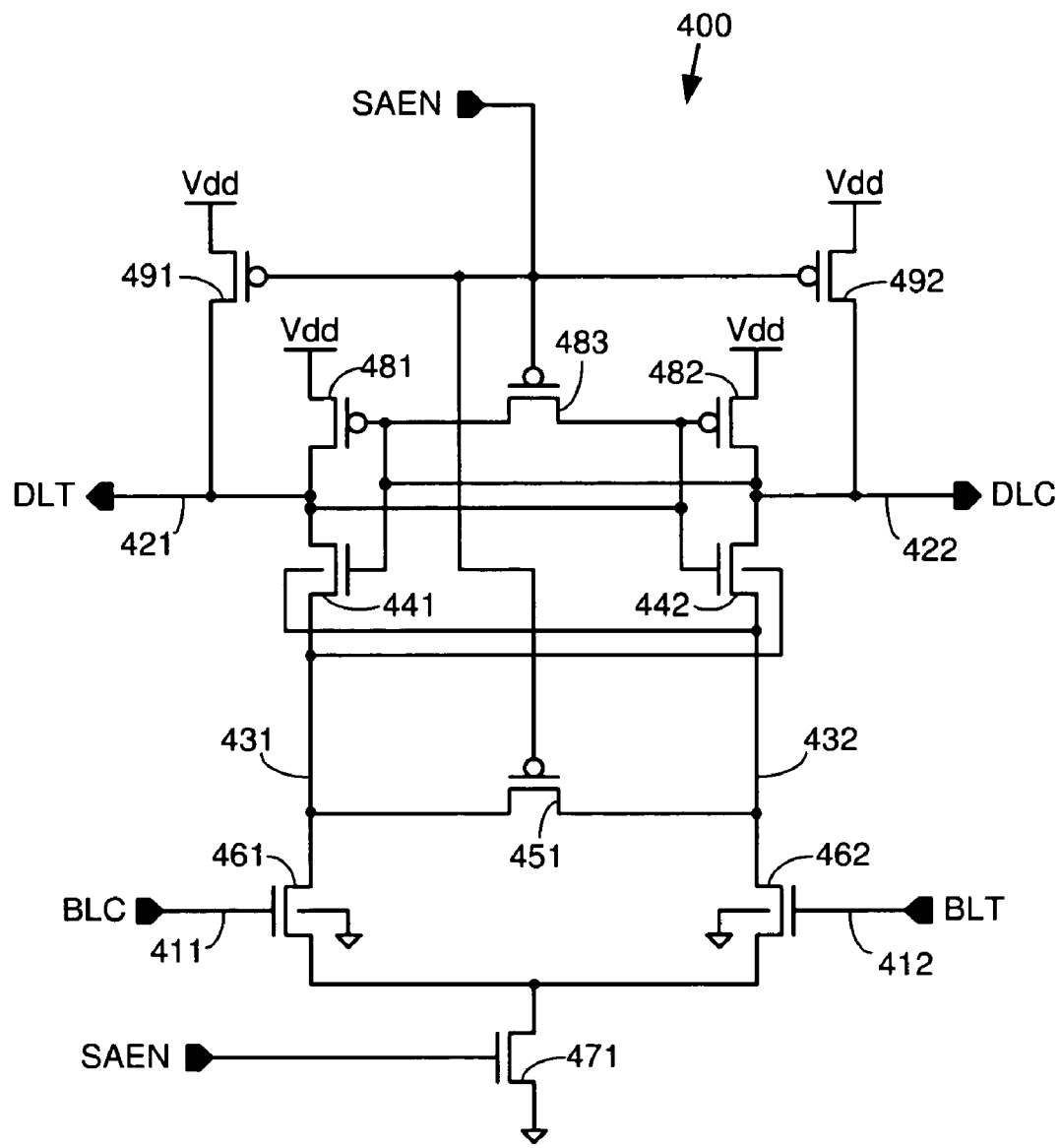
FIG. 4 is a diagram illustrating a sense amplifier that includes cross-coupling of the bodies of a pair of data line pull-down transistors to a pair of intermediate nodes in accordance with one embodiment.

Referring to FIG. 4, the design of a sense amplifier 400 that cross-couples the bodies of the upper pair of NMOS transistors to the intermediate nodes is shown. In one embodiment, sense amplifier 400 is an SOI-based device, although this is not necessarily true of other embodiments. As with the sense amplifiers described above, sense amplifier 400 is designed to sense differences between the voltages on a pair of bit lines and (411 and 412) and to amplify these small voltage differences to generate a pair of signals on data lines 421 and 422, where the difference is Vdd-ground. Sense amplifier 400 is again enabled by signal SAEN.

Data line pre-charge transistors 491 and 492 are coupled between the respective data lines (421 and 422) and a voltage source at Vdd. When SAEN is low, data line pre-charge transistors 491 and 492 are turned on, pre-charging data lines 421 and 422 to Vdd. SAEN is also coupled to the gate of upper equalization transistor 483 in order to equalize the voltages applied to the gates of data line pull-up/pull-down transistors 441, 442, 481 and 482. The gates of transistors 441 and 481 are cross-coupled to data line 422, while the gates of transistors 442 and 482 are cross-coupled to data line 421.

Data line pull-down Transistors 441 and 442 are coupled between the respective ones of the data lines (421 and 422) and the intermediate nodes (431 and 432). A lower equalization transistor 451 is coupled between intermediate nodes 431 and 432 to equalize the voltages at these nodes when SAEN is low. Intermediate nodes 431 and 432 are coupled to ground through the respective ones of bit line transistors 461 and 462, as well as enable transistor 471. Bit line transistors 461 and 462 are switched on and off by the voltages on bit lines 411 and 412, respectively. Enable transistor 471 is switched on and off by enable signal SAEN.

The difference between sense amplifier 400 and prior art sense amplifier 100 is that, where transistors 141 and 142 of the prior art sense amplifier are body-tied to ground, data line pull-down transistors 441 and 442 of sense amplifier 400 are body-tied to the opposing intermediate nodes. That is, transistor 441 is body-tied to intermediate node 432, while transistor 442 is body-tied to intermediate node 431.

As indicated above, the purpose of cross-coupling the bodies of data line pull-down transistors 441 and 442 to intermediate nodes 432 and 431 is primarily to increase the speed of sense amplifier 400. In prior art sense amplifier 100, the bodies of data line pull-down transistors 141 and 142 are tied to ground. This causes less current to flow through these transistors than if their bodies were tied to a higher voltage. Because intermediate nodes 431 and 432 are pre-charged to a voltage higher than ground (i.e., Vdd-Vth), the initial current that can flow through data line pull-down transistors 441 and 442 is greater than the current that can flow through data line pull-down transistors 141 and 142.

Sense amplifier 400 has the additional advantage of varying the voltage to which the bodies of data line pull-down transistors 441 and 442 are tied. In prior art sense amplifier 100, as the voltage on one of the data lines is pulled down more quickly than the other, the cross-coupling of the data line to the opposing transistor causes the speed with which the other data line can be pulled down to be reduced. This effect is enhanced in sense amplifier 400 by cross-coupling the body of the transistor to the intermediate node on the opposite side of the sense amplifier.

For example, if node 431 is pulled low more quickly than node 432, data line 421 is pulled low more quickly than data line 422. Because data line 421 is pulled low more quickly, data line pull-down transistor 442 is turned off more quickly than data line pull-down transistor 441. Further, because node 431 is being pulled low more quickly than node 432, the body voltage of data line pull-down transistor 442 is lower than the body voltage of data line pull-down transistor 441. The reduced body voltages cause even less current to flow through these transistors (more so in transistor 442). Because, at the same time, data line pull-up transistor 482 is being turned on more quickly than data line pull-up transistor 481, data line 421 continues to be pulled low, while data line 422 is pulled back toward Vdd. The higher initial body voltages of data line pull-down transistors 441 and 442 and the changes in the body voltages according to the voltages at intermediate nodes 431 and 432 cause data lines 421 and 422 to reach Vdd and ground more quickly, so sense amplifier 400 can be operated at a higher-speed.

Alternative Embodiment—Cross-Coupling of Pull-Down Transistor Bodies with Pre-Charge An alternative embodiment incorporates both of the mechanisms described in connection with the previous embodiments. In other words, this alternative embodiment includes a pre-charge mechanism to pre-charge the intermediate nodes to Vdd, as well as cross-coupling of the upper transistor bodies to the intermediate nodes. This alternative embodiment is illustrated in FIG. 5.

Figure 5:
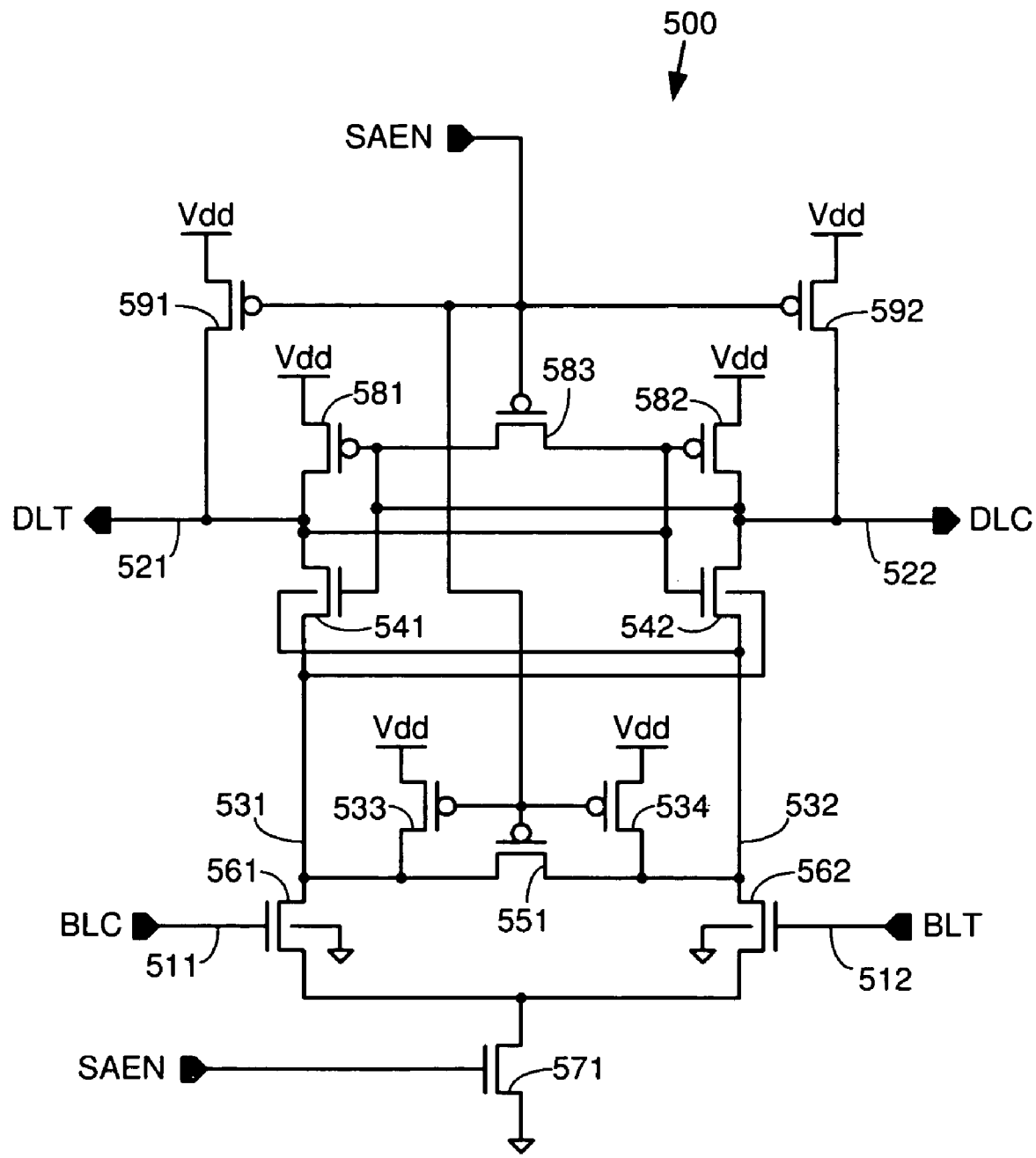
FIG. 5 is a diagram illustrating a sense amplifier that includes pre-charging circuits and cross-coupling of the bodies of a pair of data line pull-down transistors to a pair of intermediate nodes in accordance with one embodiment.

Referring to FIG. 5, sense amplifier 500 incorporates the basic design of prior art sense amplifier 100. Transistors 541, 542, 551, 561, 562, 571 581, 582, 583, 591 and 592 are interconnected in the same manner as the corresponding elements of prior art sense amplifier 100, in today's elements function in essentially the same manner as described with respect to sense amplifier 100. It is therefore necessary to describe these elements of sense amplifier 500 in detail here.

The differences between sense amplifier 500 and prior art sense amplifier 100 are the inclusion of the pre-charge mechanism and the cross-coupling of the upper transistor bodies. The pre-charge mechanism comprises PMOS transistors 533 and 534, which are coupled between a voltage source at Vdd and intermediate nodes 531 and 532, respectively. The gates of intermediate node pre-charge transistors 533 and 534 are coupled to receive the enable signal, SAEN, so that when SAEN is low, intermediate nodes 531 and 532 are pre-charged to Vdd. As described above, this provides a pre-charge path that does not include data line pull-down transistors 541 and 542, so intermediate nodes 531 and 532 are fully pre-charged to Vdd, instead of Vdd-Vth, where Vth is the threshold voltage of the respective one of data line pull-down transistors 541 and 542.

The use of this pre-charge mechanism provides various advantages over the prior art. For example, pre-charging intermediate nodes 531 and 532 to the supply voltage, Vdd, causes bit line transistors 561 and 562 to operate in the saturation region, rather than in the linear region, so the current difference between these transistors is greater than if nodes 531 and 532 were pre-charged to a lower voltage. By increasing the current through bit line transistors 561 and 562, the sensitivity of sense amplifier 500 to threshold voltage variations is reduced. Additionally, pre-charging nodes 531 and 532 to a higher voltage (i.e., Vdd, instead of Vdd-Vth) causes lower equalization transistor 551 to be switched on more strongly, thereby providing better equalization between the voltages at nodes 531 and 532.

In addition to the use of the pre-charge mechanism, sense amplifier 500 implements cross-coupling of the data line pull-down transistors (541 and 542) to the intermediate nodes (531 and 532). More specifically, the body of data line pull-down transistor 541 is coupled to intermediate node 532, while the body of data line pull-down transistor 542 is coupled to intermediate node 531. This raises the body voltages of data line pull-down transistors 541 and 542 from ground (conventionally, the upper NMOS transistors of a sense amplifier are tied to ground) to a higher voltage, which increases the current flowing through the transistors and consequently increases the speed with which they can be operated. Further, because the voltages at nodes 531 and 532 vary, the cross-coupling enhances the effect of turning off the one of data line pull-down transistors 541 and 542 on the same side as the one of intermediate nodes 531 and 532 that is being pulled low more rapidly than the other. This makes sense amplifier 500 less likely to malfunction (i.e., less likely to generate incorrect outputs on data lines and 521 and 522.

Alternative Embodiment—Bit Line Cross-Coupling

In another alternative embodiment, the problems of prior art sense amplifier 100 can be reduced or eliminated by providing cross-coupling of the intermediate nodes between the upper and lower NMOS transistor pairs to the input bit lines of the sense amplifier. In this case, the equalization transistor that is normally provided between the intermediate nodes is removed. A pair of PMOS transistors are provided to switch on or off the cross-coupling between the input bit lines and the intermediate nodes. This causes the intermediate nodes to be pre-charged to the voltages on the input bit lines. As a result of pre-charging the intermediate nodes to the bit line voltages, the sense amplifier is less sensitive to differences in the threshold voltages of the upper pair of NMOS transistors. Pre-charging the intermediate nodes to the bit line voltages also improves current differences between the two sides of the sense amplifier, as compared to prior art sense amplifiers.

Figure 6:
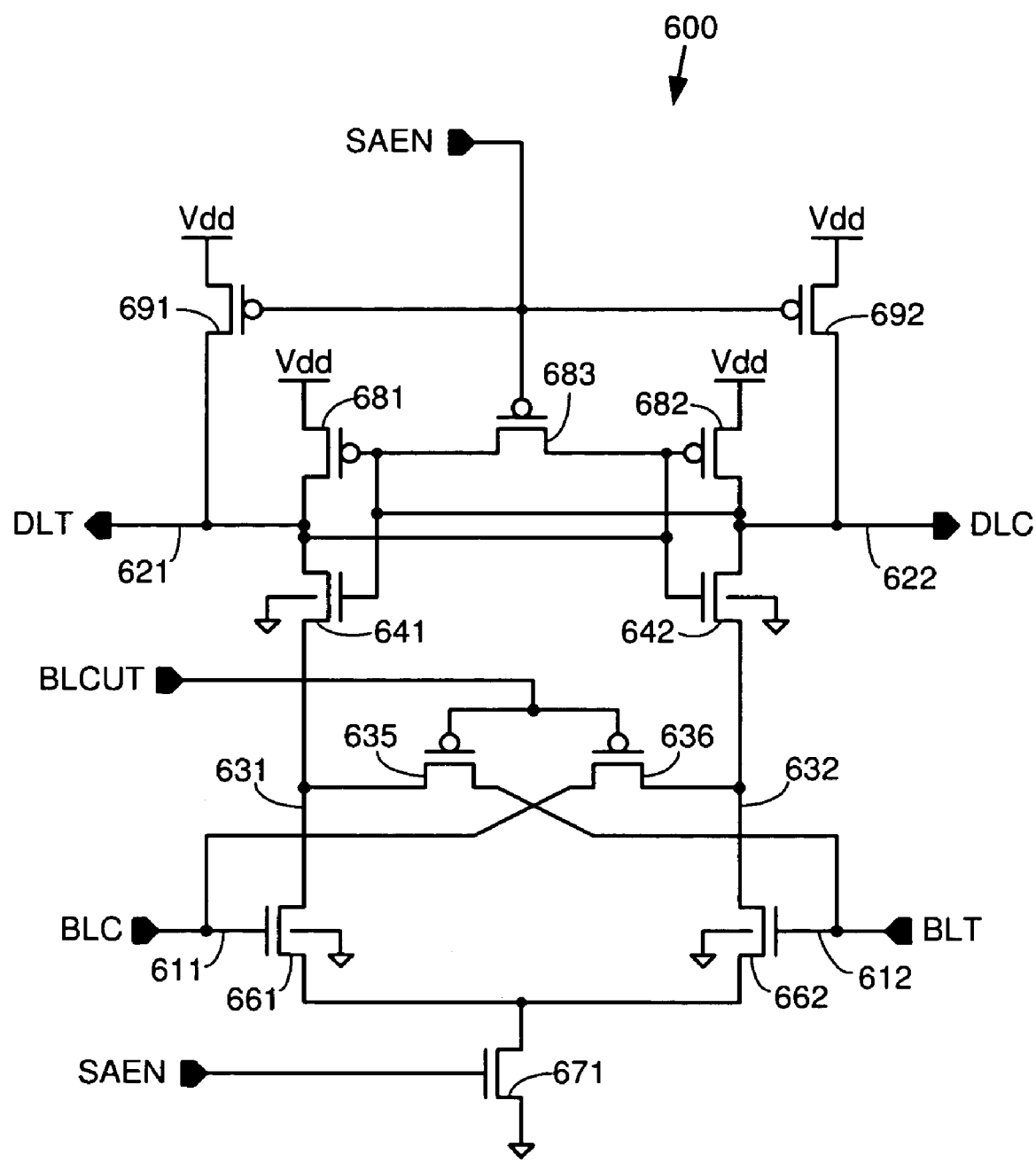
FIG. 6 is a diagram illustrating a sense amplifier that includes cross-coupling of a pair of input bit lines to a pair of intermediate nodes in accordance with one embodiment.

Referring to FIG. 6, the design of a sense amplifier 600 in accordance with this alternative embodiment is shown. In one embodiment, sense amplifier 600 is implemented using SOI technology. Much of the design is very similar to the design of prior art sense amplifier 100, including the configuration of transistors 641, 642, 661, 662 671, 681, 682, 683, 691 and 692. Sense amplifier 600 also includes input bit lines 611 and 612, and output data lines 621 and 622. Sense amplifier 600 is enabled by signal SAEN.

Sense amplifier 600 differs from prior art sense amplifier 100 in that lower equalization transistor 151 is removed. Instead of this equalization transistor, sense amplifier 600 cross-couples intermediate nodes 631 and 632 to the opposing ones of input bit lines 611 and 612. The intermediate nodes and input bit lines are cross-coupled through a pair of PMOS transistors 635 and 636, which are switched on and off by signal BLCUT. Thus, the source of transistor 636 is connected to bit line 611, while the drain of this transistor is connected to intermediate node 632. Similarly, the source of transistor 635 is connected to bit line 612, while the drain of this transistor is connected to intermediate node 631. The gates of transistors 635 and 636 are both coupled to receive signal BLCUT.

The purpose of the cross-coupling mechanism in sense amplifier 600 is to pre-charge intermediate nodes 631 and 632 to slightly different voltages that favor the correct operation of the sense amplifier. In other words, because all of the sense amplifiers above are designed to pull the voltage low more rapidly at the intermediate node on the side of the input bit line that is higher, it is advantageous to pre-charge this intermediate node to a lower voltage than the other intermediate node. This is accomplished by cross-coupling the intermediate nodes to the input bit lines.

Figure 7:
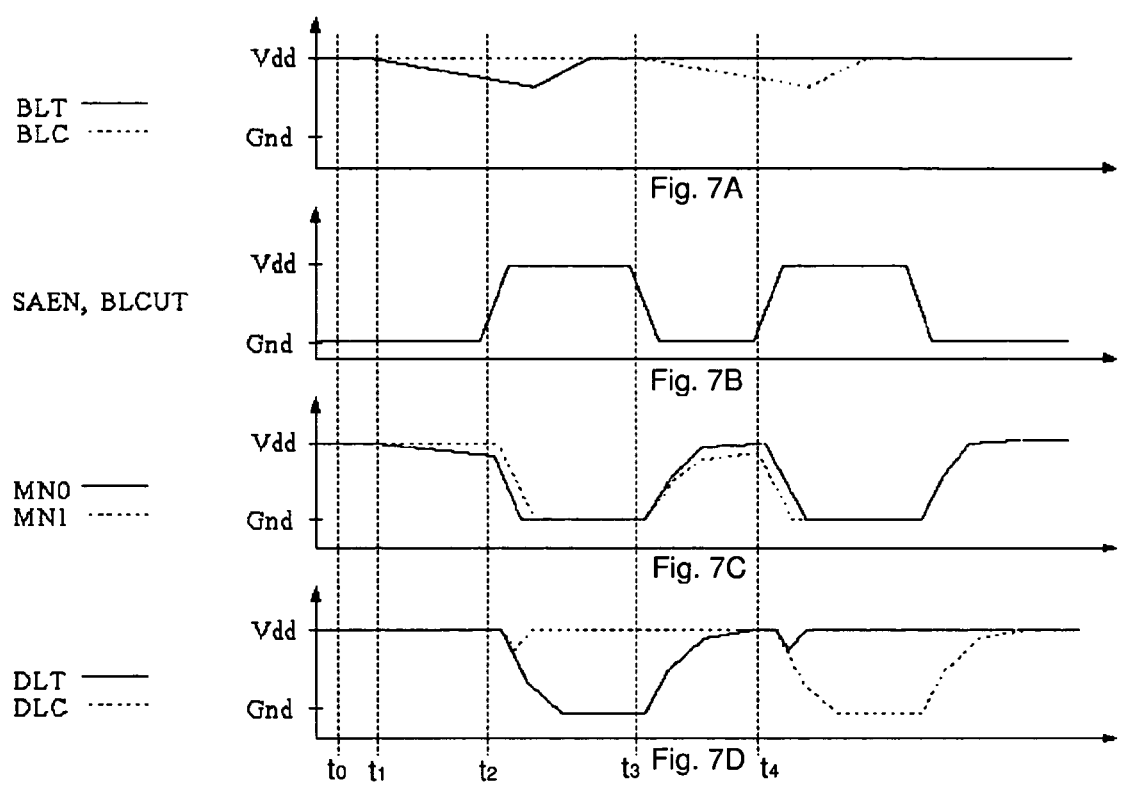
FIGS. 7A–7D are a set of diagrams illustrating the signals associated with the sense amplifier shown in FIG. 6.

The operation of sense amplifier 600 will now be explained with reference to FIG. 7. FIG. 7 includes a series of diagrams illustrating the signals at various points in sense amplifier 600 as a function of time. FIG. 7A shows the signals on bit lines 611 and 612. FIG. 7B shows signals SAEN and BLCUT. FIG. 7C shows the voltages at intermediate nodes 631 and 632. FIG. 7D shows the voltages at output data lines 621 and 622.

When sense amplifier 600 is not enabled (i.e., when SAEN is low, see FIG. 7B), data line pre-charge transistors 691 and 692 are switched on, pre-charging output data lines 621 and 622 to Vdd, as shown in FIG. 7D. In this example, signal BLCUT is identical to enable signal SAEN, so transistors 635 and 636 are also switched on, pre-charging intermediate nodes 631 and 632 to the voltages on input bit lines 612 and 611, respectively.

Initially (e.g., at time $t_0$), input bit lines 611 and 612 are both pre-charged to Vdd. Then, at time $t_1$, the voltage on input bit line 612 begins to drop from Vdd to some lower voltage, while the voltage on input bit line 611 remains at Vdd. Because BLCUT is still low, transistors 635 and 636 are still switched on, and the voltage at intermediate node 631 begins to drop with the voltage on input bit line 612. The voltage at intermediate nodes 632 is coupled to input bit line 611, so it remains at Vdd.

When enable signal SAEN goes high and (beginning at time $t_2$), transistors 691 and 692 are switched off, so output data lines 621 and 622 are no longer being pre-charged to Vdd. Because signal BLCUT is identical to SAEN in this instance, transistors 635 and 636 are also switched off, so that intermediate nodes 631 and 632 are no longer being pre-charged to the voltages on input bit lines 612 and 611. At the same time these pre-charge transistors are switched off, transistor 671 is switched on, so that current can begin to flow through transistors 641, 642, 661 and 662. Because the voltage on input bit line 611 is higher than the voltage on input bit line 612, transistors 661 is switched on more strongly than transistor 662. This causes the voltage at intermediate node 631 to be pulled low more quickly than the voltage at node 632. It is therefore easy to see that the pre-charging of intermediate node 631 to the slightly lower voltage on input bit line 612 (as compared to the pre-charging of node 632 to the voltage, Vdd, on input bit line 611) adds to the more rapid pull-down of the voltage at node 631, thereby enhancing the operation of sense amplifier 600.

As with the other sense amplifiers, the more rapidly dropping voltage at intermediate node 631 causes the voltage at output data lines 621 to be pulled low more quickly than the voltage at output data line 622. This, in turn, causes data line pull-down transistor 642 to be switched off more rapidly than data line pull-down transistor 641, and also causes data line pull-up transistor 682 to be switched on more rapidly than data line pull-up transistor 681. As this reaction progresses, output data line 621 is pulled to ground, and output data lines 622 is pulled to Vdd.

When signals SAEN and BLCUT go low again and (beginning at time $t_3$), enable transistor 671 is switched off, disabling sense amplifier 600, and transistors 635, 636, 691 and 692 are switched on, so that output data lines 621 and 622, as well as intermediate nodes 631 and 632, can begin pre-charging again. Because output data line 622 was pulled to Vdd, it is already pre-charged at time $t_3$. Because output data line 621 was pulled to ground, it takes some time before it is pre-charged to Vdd. Because both intermediate nodes, 631 and 632, were pulled to ground, they both require some time to pre-charge to the voltages on the input bit lines, 612 and 611. It can be seen from FIG. 7C that, because input bit line 612 is now at Vdd and input bit line 611 is at some lower voltage, intermediate node 631 is pre-charged to Vdd, while intermediate node 632 is pre-charged to the lower voltage on bit line 611. Signals SAEN and BLCUT then go high again (beginning at time $t_4$), and the process is repeated.

Alternative Embodiment—Bit Line Cross-Coupling with Pre-Charge

In another alternative embodiment, the problems of prior art sense amplifier 100 can be reduced or eliminated by providing cross-coupling of the intermediate nodes between the upper and lower NMOS transistor pairs to the input bit lines of the sense amplifier, and also pre-charging the intermediate nodes to a predetermined voltage, such as the power supply voltage, Vdd. In this embodiment, because both of these mechanisms are intended to drive the voltages at the intermediate nodes to preferred levels, and because each mechanism may drive the voltages to slightly different levels, the mechanisms are activated at slightly different times. In one embodiment, the pre-charge mechanism is activated before the cross-coupling mechanism, and also deactivated before the pre-charge mechanism. In this manner, the intermediate nodes are pre-charged to Vdd, and then the voltages are pulled down to the voltages of the cross-coupled bit lines. Both of these mechanisms are decoupled before the sense amplifier is enabled.

Figure 8:
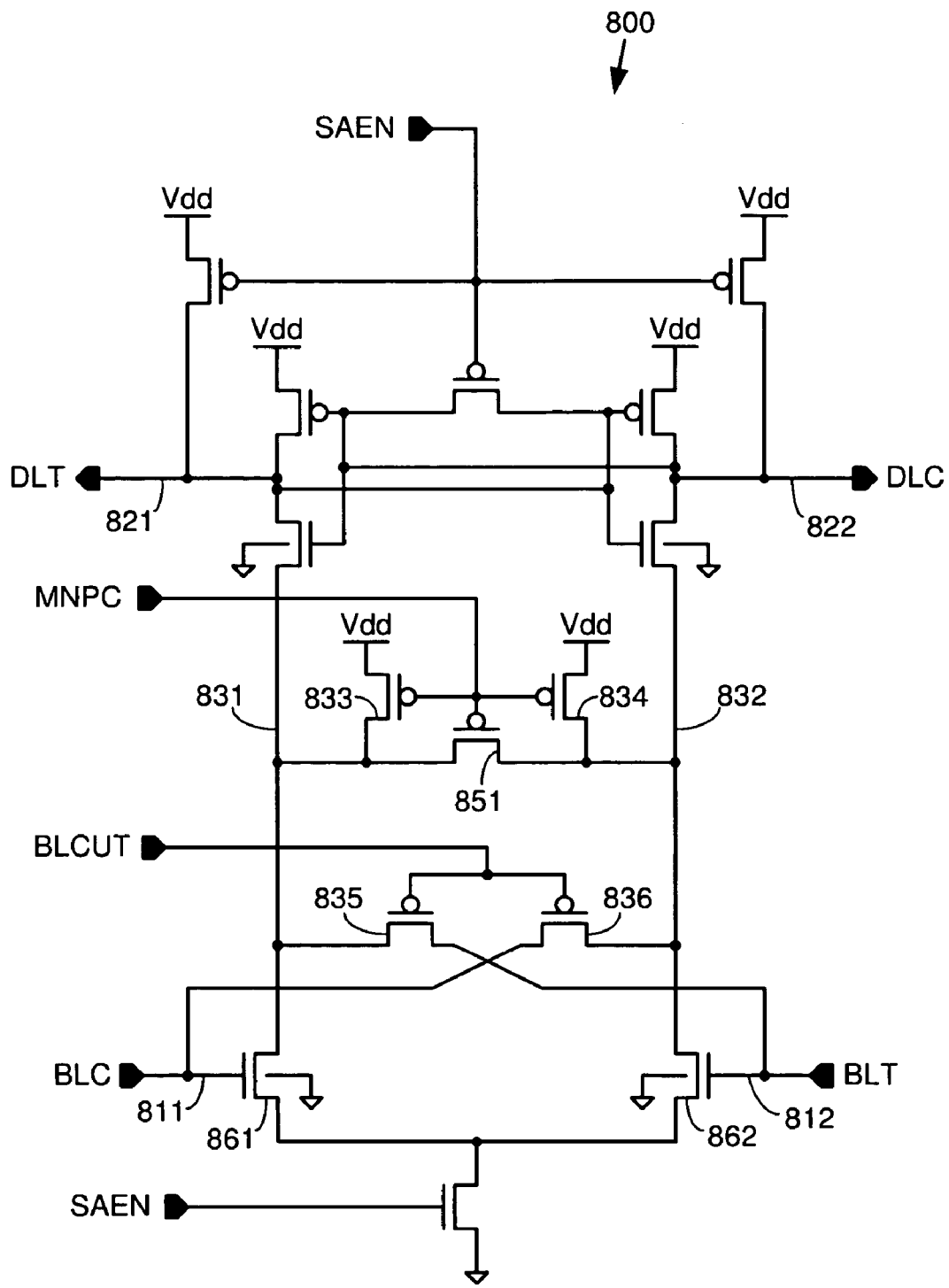
FIG. 8 is a diagram illustrating a sense amplifier that includes pre-charging circuits and cross-coupling of a pair of input bit lines to a pair of intermediate nodes in accordance with one embodiment.

Referring to FIG. 8, the design of a sense amplifier in accordance with this alternative embodiment is shown. The design of sense amplifier 800 is identical to the design of sense amplifier 600, except that a pre-charge mechanism of the type described above in connection with sense amplifier 300 is added. Consequently, not all of the components of sense amplifier 800 will be described in detail here. Those components which are not described operate in the same manner as described above in connection with the other embodiments.

Like sense amplifier 600, sense amplifier 800 implements cross-coupling of the input bit lines, 811 and 812, to intermediate nodes 832 and 831, respectively. Input bit line 811 is coupled to intermediate node 832 via PMOS transistor 836. Input bit line 812 is coupled to intermediate node 831 via PMOS transistor 835. Transistors 835 and 836 are both controlled by signal BLCUT, which is provided to the gates of these transistors.

Unlike sense amplifier 600, sense amplifier 800 does not eliminate the lower equalization transistor. Instead, lower equalization transistor 851 is retained. Lower equalization transistor 851 works in conjunction with intermediate node pre-charge transistors 833 and 834 to pre-charge intermediate nodes 831 and 832 to the power supply voltage, Vdd.

Transistor 833 is coupled between Vdd and intermediate node 831, while transistor 834 is coupled between Vdd and intermediate node 832. The gates of intermediate node pre-charge transistors 833 and 834 are both coupled to receive signal MNPC. It should be noted that lower equalization transistor 851 is coupled to receive signal MNPC, instead of enable signal SAEN.

Figure 9:
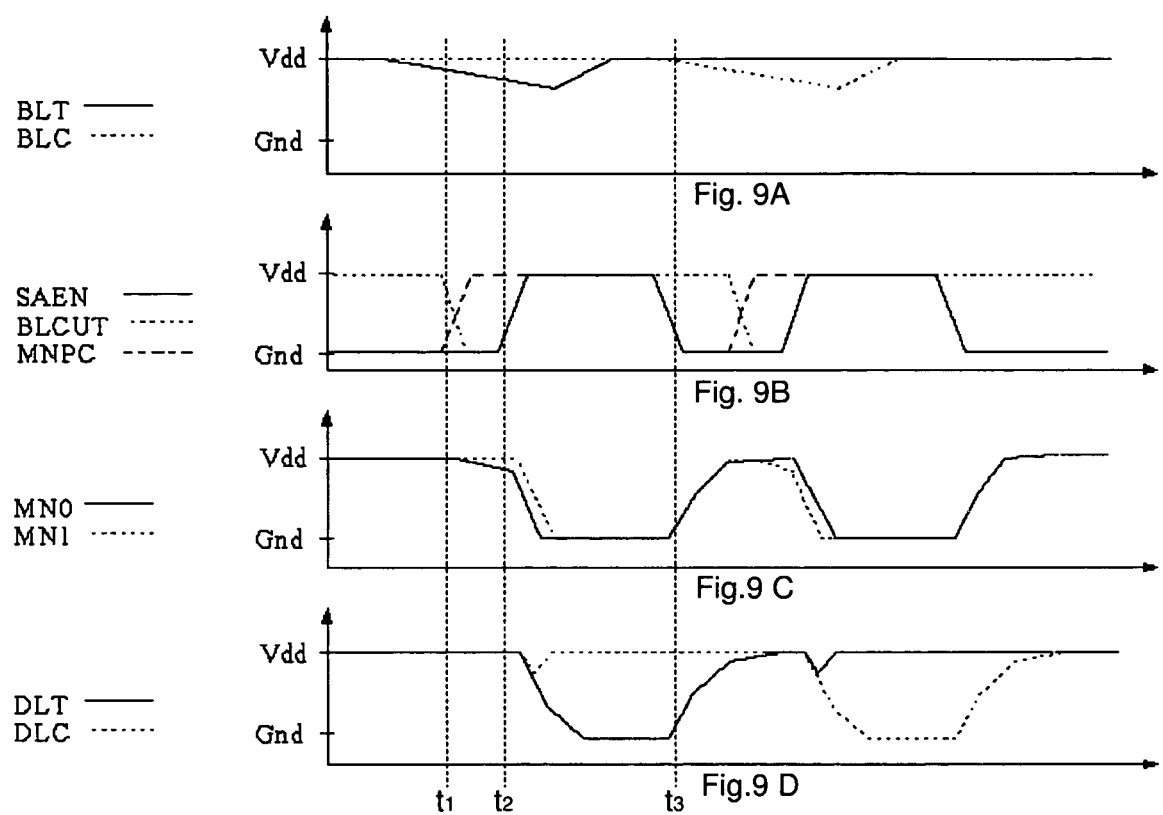
FIGS. 9A–9D are a set of diagrams illustrating the signals associated with the sense amplifier shown in FIG. 8.

Referring to FIG. 9, a series of diagrams illustrating the signals as a function of time is shown for various points in sense amplifier 800. FIG. 9A shows the signals on bit lines 811 and 812. FIG. 9B shows signals SAEN, BLCUT and MNPC. FIG. 9C shows the voltages at intermediate nodes 831 and 832. FIG. 9D shows the voltages at output data lines 821 and 822.

Initially, sense amplifier 800 is not enabled (i.e., SAEN is low). MNPC is also low, and BLCUT is high. Because BLCUT is high, cross-coupling transistors 835 and 836 are switched off. Intermediate nodes 831 and 832 are therefore decoupled from input bit lines 811 and 812. Because MNPC is low, transistors 833 and 834 are switched on, allowing intermediate nodes 831 and 832 to be pre-charged to Vdd. Lower equalization transistor 851 is also switched on, so that the voltages are equalized between intermediate nodes 831 and 832.

At time $t_1$, signal MNPC begins to go high, switching off transistors 833, 834 and 851. In other words, the mechanism for pre-charging intermediate nodes 831 and 832 to Vdd is shut off. At the same time, signal BLCUT begins to go low. When BLCUT goes low, this switches on cross-coupling transistors 835 and 836. Intermediate nodes 831 and 832 are thereby coupled to input bit lines 812 and and 811. In the example of FIG. 9A, the voltage on input bit line 811 is at Vdd, while the voltage on input bit line 812 is slightly lower. As a result, the voltage at intermediate node 832 remains at Vdd (the voltage to which it was pre-charged), while the voltage at intermediate node 831 is pulled down slightly to match the voltage at input bit line 812.

At time $t_2$, both SAEN and BLCUT begin to go high. When BLCUT goes high, cross-coupling transistors 835 and 836 are switched off, decoupling intermediate nodes 831 and 832 from the input bit lines, 812 and 811. When SAEN goes high, sense amplifier 800 is enabled. Because the voltage at intermediate node 831 is slightly lower than the voltage at intermediate node 832, and because bit line transistor 861 is switched on more strongly than bit line transistor 862, the voltage at intermediate node 831 is pulled low more quickly than the voltage at intermediate node 832. As a result, output data line 821 is pulled to ground, while output data line 822 is pulled to Vdd.

At time $t_3$, signals SAEN and MNPC begin to go low. When SAEN goes low, sense amplifier 800 is no longer enabled. When MNPC goes low, the pre-charge mechanism (transistors 833, 834 and 851) is switched on, and the process is repeated.

Alternative Embodiment—Cross-Coupling of Pull-Down Transistor Bodies and Bit Line Cross-Coupling with Pre-Charge In still another alternative embodiment, the problems of prior art sense amplifier 100 can be reduced or eliminated by providing all three of the mechanisms described above. In other words, a sense amplifier of an alternative embodiment may incorporate cross-coupling of the upper transistor bodies to the intermediate nodes, cross-coupling of the intermediate nodes to the input bit lines, and also pre-charging of the intermediate nodes to a predetermined voltage.

Figure 10:
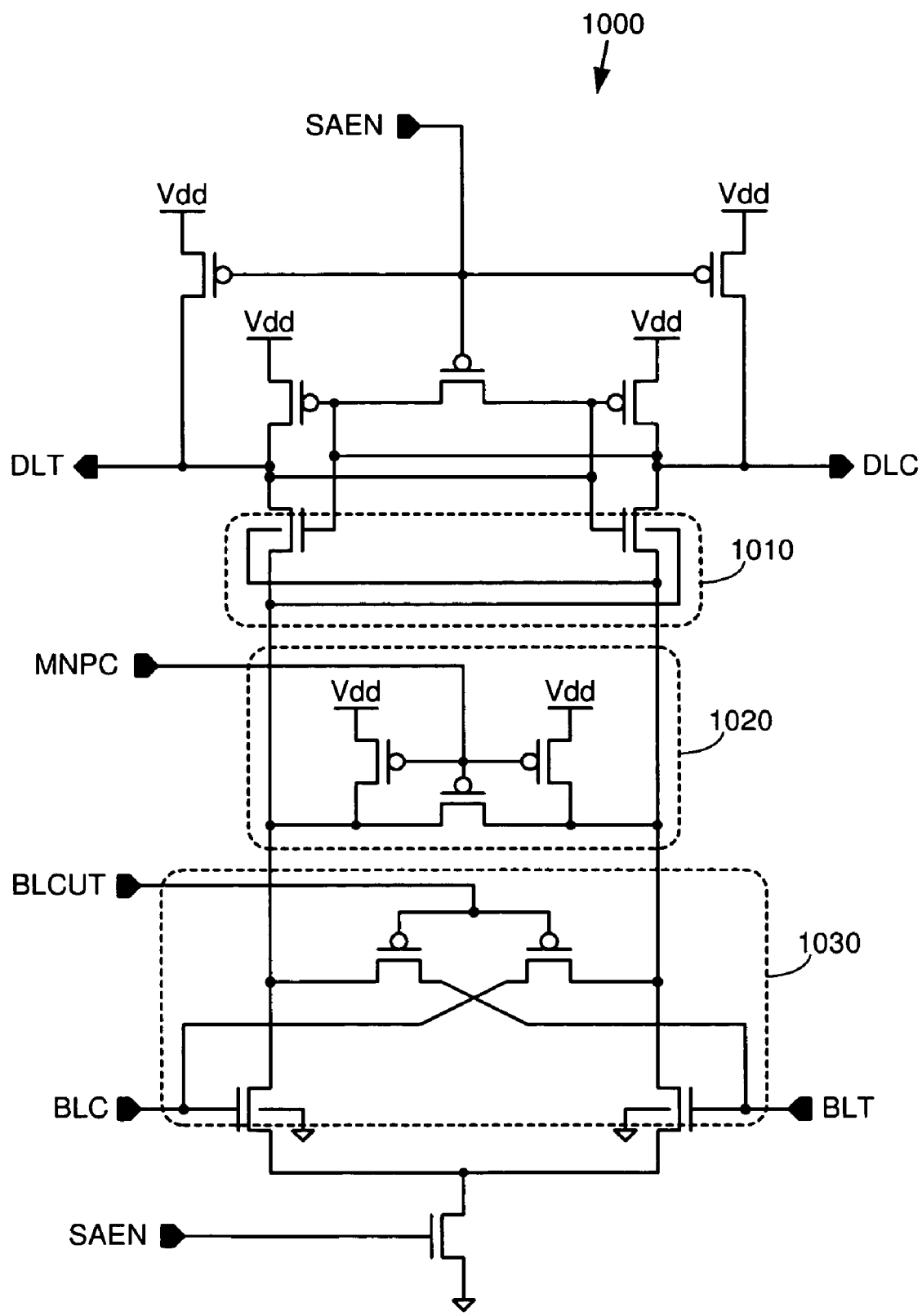
FIG. 10 is a diagram illustrating a sense amplifier that includes pre-charging circuits, cross-coupling of the bodies of a pair of data line pull-down transistors to a pair of intermediate nodes, and cross-coupling of a pair of input bit lines to the pair of intermediate nodes in accordance with one embodiment.

Referring to FIG. 10, the design of a sense amplifier in accordance with this alternative embodiment is shown. The design of sense amplifier 1000 is identical to the design of sense amplifier 800. That is, sense amplifier 1000 includes a bit line cross-coupling mechanism 1030 and a pre-charge mechanism 1020, each of which is described in connection with sense amplifier 800. Sense amplifier 1000 differs from sense amplifier 800 in that a transistor-body cross-coupling mechanism 1010 of the type described above in connection with sense amplifiers 400 and 500 is added.

Because all three of the mechanisms implemented in sense amplifier 1000 have already been described above, they will be described in detail here. It is sufficient to note that the structures of the respective mechanisms and the manner in which they operate is the same as described above.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

What is claimed is:

1. A sense amplifier comprising:
 a pair of input bit lines;
 a pair of output data lines;
 a pair of bit line transistors; and
 a pair of data line pull-down transistors;
 wherein each input bit line is coupled to the gate of a corresponding one of the bit line transistors, each output data line is coupled to the source of a corresponding one of the data line pull-down transistors, and the drain of the corresponding data line pull-down transistor and the source of the corresponding bit line transistor are coupled to a corresponding intermediate node; and
 wherein each of the data line pull-down transistors is body-tied to an opposing one of the intermediate nodes.

2. The sense amplifier of claim 1, wherein the bit line transistors and the data line pull-down transistors comprise silicon-on-insulator (SOI) transistors.

3. The sense amplifier of claim 1, further comprising a pair of pre-charge circuits, wherein each pre-charge circuit is coupled to a corresponding one of the intermediate nodes and configured to pre-charge the corresponding intermediate node to a predetermined voltage while the sense amplifier is not enabled.

4. The sense amplifier of claim 3, wherein each of the pre-charge circuits comprises a pre-charge transistor coupled between the corresponding one of the intermediate nodes and a voltage source.

5. The sense amplifier of claim 4, wherein the voltage source comprises a power supply at voltage Vdd.

6. The sense amplifier of claim 4, wherein the source of the pro-charge transistor is coupled to the voltage source, the drain of the pre-charge transistor is coupled to the intermediate node, and the gate of the pro-charge transistor is coupled to receive a signal that switches the pre-charge transistor on when the sense amplifier is not enabled and switches the pre-charge transistor off when the sense amplifier is enabled.

7. The sense amplifier of claim 6, wherein the gate of the pre-charge transistor is coupled to receive an enable signal that is high when the sense amplifier is enabled and low when the sense amplifier is not enabled, wherein the pro-charge transistor is configured to be switched off when the enable signal is high and switched on when the enable signal is low.

8. The sense amplifier of claim 3, wherein each of the pre-charge circuits provides a pre-charge path that does not include the corresponding one of the data line pull-down transistors.

9. The sense amplifier of claim 1, further comprising a pair of data line pull-up transistors, wherein each of the data line pull-up transistors is coupled between a corresponding one of the data lines and a voltage source, wherein each of the data line pull-up transistors is cross-coupled to the opposing one of the data lines.

10. The sense amplifier of claim 9, wherein each of the data line pull-down transistors is cross-coupled to the opposing one of the data lines.

11. The sense amplifier of claim 10, wherein for each data line, the gates of the corresponding data line pull-up transistor and data line pull-down transistor are connected to each other and to the opposing data line.

12. The sense amplifier of claim 11, further comprising an upper equalization transistor coupled between the gates of the data line pull-up transistor and data line pull-down transistor corresponding to a first one of the data lines and the gates of the data line pull-up transistor and data line pull-down transistor corresponding to the other one of the data lines, wherein the upper equalization transistor is switched on when the sense amplifier is not enabled and switched off when the sense amplifier is enabled.

13. The sense amplifier of claim 1, further comprising a pair of data line pre-charge transistors, wherein each of the data line pro-charge transistors is coupled between a corresponding one of the data lines and a voltage source, wherein each of the data line pre-charge transistors is coupled to receive a signal that switches the data line pre-charge transistors on when the sense amplifier is not enabled and switches the data line pre-charge transistors off when the sense amplifier is enabled.

14. The sense amplifier of claim 1, further comprising a lower equalization transistor coupled between the intermediate nodes, wherein the lower equalization transistor is switched on when the sense amplifier is not enabled and switched off when the sense amplifier is enabled.

15. A method comprising:
providing a sense amplifier having a pair of input bit lines and a pair of output data lines,
wherein each input bit line is coupled to a corresponding one of the output data lines via a corresponding bit line transistor and a corresponding data line pull-down transistor,
wherein the input bit line is coupled to the gate of the bit line transistor, the output data line is coupled to the source of the data line pull-down transistor, and the drain of the data line pull-down transistor and the source of the bit line transistor are coupled to an intermediate node; and
charging the body of each data line null-down transistor to a voltage on an opposing one of the bit lines.

16. The method of claim 15, wherein providing a sense amplifier comprises providing a sense amplifier that includes silicon-on-insulator (SOI) bit line transistors and data line pull-down transistors.

17. The method of claim 15, wherein charging the body of each data line pull-down transistor to a voltage on an opposing one of the bit lines comprises coupling the body of each data line pull-down transistor to the opposing one of the bit lines.

18. The method of claim 15, further comprising pre-charging the intermediate node corresponding to each input bit line to a voltage source at a predetermined voltage while the sense amplifier is not enabled.

19. The method of claim 18, wherein the intermediate node corresponding to each input bit line is pre-charged by coupling the intermediate node to the voltage source through a pre-charge path that does not include the data line pull-down transistor.

20. The method of claim 19, further comprising enabling the sense amplifier after pre-charging the intermediate node corresponding to each input bit line.

21. The method of claim 19, wherein pro-charging the intermediate node corresponding to each input bit line comprises coupling the intermediate node to a voltage source having the predetermined voltage.

22. The method of claim 21, wherein the predetermined voltage comprises a power supply voltage, Vdd.

23. The method of claim 21, further comprising decoupling the pre-charge path between the intermediate node and the voltage source prior to enabling the sense amplifier.

24. The method of claim 21, wherein coupling the intermediate node to the predetermined voltage through the pre-charge path comprises connecting an intermediate node pre-charge transistor between the intermediate node and the voltage source and switching the intermediate node pre-charge transistor on.

25. The method of claim 24, further comprising decoupling the pre-charge path between the intermediate node and the voltage source prior to enabling the sense amplifier.

26. The method of claim 25, wherein decoupling the pre-charge path comprises switching the intermediate node pre-charge transistor off.

* * * * *